(12) United States Patent
Tanei et al.

(10) Patent No.: US 6,815,073 B2
(45) Date of Patent: Nov. 9, 2004

(54) ELECTRONIC COMPONENT AND METHOD OF MANUFACTURING THE SAME

(75) Inventors: Hirayoshi Tanei, Yokohama (JP); Tsuyoshi Fujita, Yokohama (JP); Masato Kirigaya, Yokohama (JP); Yasuo Akutsu, Mito (JP); Kaoru Uchiyama, Oomiya (JP); Hiroshi Soma, Johoku (JP); Hiroatsu Tokuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/941,988

(22) Filed: Aug. 30, 2001

(65) Prior Publication Data
US 2002/0197488 A1 Dec. 26, 2002

(30) Foreign Application Priority Data
Jun. 8, 2001 (JP) ........................................ 2001-174690

(51) Int. Cl.$^7$ ........................... B32B 17/06; B05D 3/02; C22C 5/06
(52) U.S. Cl. ..................... 428/434; 428/432; 428/433; 428/697; 75/245; 75/255; 420/505; 427/372.2; 427/375; 427/376.3; 427/376.4
(58) Field of Search .............................. 427/372.2, 375, 427/376.3, 376.4; 75/245, 255; 428/432, 323, 209, 469; 420/501, 505

(56) References Cited

U.S. PATENT DOCUMENTS

| | | | | |
|---|---|---|---|---|
| 3,872,360 A | * | 3/1975 | Sheard | 361/305 |
| 4,336,551 A | * | 6/1982 | Fujita et al. | 257/658 |
| 5,292,359 A | * | 3/1994 | Jeng-Shyong et al. | 75/351 |
| 5,527,627 A | * | 6/1996 | Lautzenhiser et al. | 428/615 |
| 5,652,042 A | * | 7/1997 | Kawakita et al. | 428/209 |
| 6,338,893 B1 | * | 1/2002 | Kodera et al. | 428/210 |
| 6,404,318 B1 | * | 6/2002 | Uchikoba et al. | 336/200 |

FOREIGN PATENT DOCUMENTS

JP     1-298090     1/1989

* cited by examiner

*Primary Examiner*—Stephen Stein
*Assistant Examiner*—G. Blackwell-Rudasill
(74) *Attorney, Agent, or Firm*—Antonelli, Terry, Stout & Kraus, LLP

(57) ABSTRACT

The present invention has an object to enhance the reliability of the electrical connection of a silver-based conductor film on the surface of a glass ceramic board. In order to achieve the object, according to the present invention, by the use of a conductor paste containing a silver particle having a specific surface area of 0.3 m$^2$/g to 3.0 m$^2$/g and no glass, printing is carried out on a glass ceramic board and the conductor paste is fired at a firing temperature having a difference of ±50° C. from a softening temperature of amorphous borosilicate glass contained in the glass ceramic. Consequently, a silver-based conductor film having high reliability of the electrical connection is formed on the ceramic board.

9 Claims, 5 Drawing Sheets

ELECTRONIC COMPONENT AND METHOD OF MANUFACTURING THE SAME

BACKGROUND OF THE INVENTION

1. Field of the Invention

The present invention relates to a technique for forming a silver-based conductor film on a surface of an electronic component board including glass.

2. Description of the Related Art

A low temperature co-fired ceramic (LTCC) multilayer printed circuit board is formed by laminating and firing a green sheet of glass ceramic having a sintering temperature of 1000° C. or less after conductor paste printing. A bonding pad provided on the surface of the low temperature sintered ceramic multilayer printed circuit board is formed by a thick film processing, for example. More specifically, a thick film conductor paste is printed on the surface of the LTCC multilayer printed circuit board and is then fired. For the thick film conductor paste thus used, Japanese Laid-Open Patent Publication No. 1-298090 has described a conductor composition obtained by kneading silver-based metal powder which can be fired in the air and inorganic additives (such as glass frit, a bismuth compound, zinc and/or a zinc compound, nickel and/or a nickel compound).

For a conductor pattern on the board surface, it is generally required that (1) a solder wettability is good, (2) a bonding strength to the board is great and (3) a bond with a gold wire is reliable.

However, in the case where the conductor pattern on the surface of the LTCC multilayer printed circuit board is formed of a silver-based conductor, it is hard to satisfy all the three requirements (1), (2) and (3) for the conductor pattern. For example, the bonding pad formed of the silver-based conductor is not suitable for the wire bonding of the gold wire.

SUMMARY OF THE INVENTION

The present invention has an object to more enhance the reliability of the electrical connection of a silver-based conductor pattern on the surface of a glass ceramic board. In order to achieve the above-mentioned object, according to the present invention, a conductor paste containing silver particles having a specific surface area of 0.3 $m^2/g$ to 3.0 $m^2/g$ is fired at a temperature having a difference of ±50° C. from the softening temperature of glass, thereby forming a conductor film on the glass ceramic board.

BRIEF DESCRIPTION OF THE INVENTION

DESCRIPTION OF THE PREFERRED EMBODIMENTS

An embodiment of the present invention will be described below with reference to the accompanying drawings.

First of all, description will be given to the result of investigation for the surface state of a silver-based conductor film formed on the surface of a ceramic board.

Figure 1:
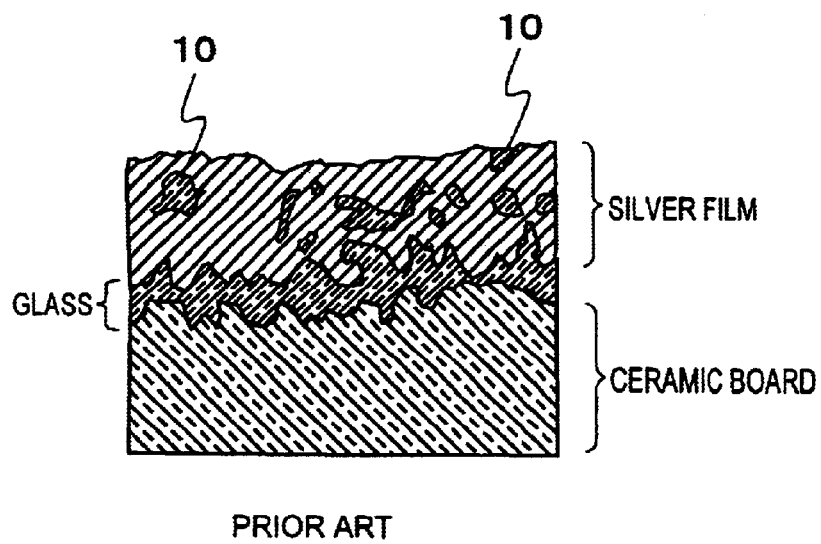
FIG. 1 is a sectional view showing a silver-based conductor film and a glass ceramic board which are formed by firing a conductor paste containing glass.

A high melting-point oxide such as alumina and a silver-based conductor are difficult to react to each other even if they are fired. For this reason, even if by the use of a conductor paste containing silver-based conductor powder, printing is carried out on a ceramic board or green sheet containing the alumina and is collectively fired, the silver-based conductor film and the ceramic board are not bonded to each other with a sufficient strength. In order to enhance the bonding strength of the silver-based conductor film and the ceramic board, it is preferable that glass such as zinc borosilicate glass (a softening point of 660° C.) should be added to the conductor paste. From the observation of a silver-based conductor film formed by using the conductor paste having the glass added thereto, it was confirmed that a glass 10 is exposed from a surface as shown in FIG. 1. More specifically, it was found that a part of the glass of the conductor paste soaks out over the surface of the silver-based conductor film during the firing. In particular, it has been found that glass easily soaks out over the surface of the silver-based conductor film if amorphous borosilicate glass (a softening point of 820° C. and a coefficient of thermal expansion: $2.5 \times 10^{-6}/°$ C.) having high reliability of connection of a bare chip LSI (Large Scale Integration) and low thermal expansion is contained as a glass component in a board material.

If the glass is exposed from the surface of the silver-based conductor film, solder is difficult to wet and spread so that the strength of a solder bonding portion is reduced. Moreover, a contact between the silver-based conductor and a gold wire is inhibited. Therefore, the bonding strength of the gold wire is also reduced. Accordingly, soaking out of the glass to the surface of the silver-based conductor film during the firing may contribute to deterioration of the reliability of the electric connection of the silver-based conductor film.

In the present embodiment, the following experiment was carried out by using a conductor paste containing no glass component in order to narrow down the conditions for forming a silver-based conductor film having high reliability of the electrical connection. In this embodiment, amorphous borosilicate glass was added to a board material.

First of all, a sample was prepared in the following procedure.

(1) Preparation of Ceramic Board

Borosilicate glass powder (55% by weight) and alumina powder (45% by weight) were mixed to prepare a raw material. Approximately 14 parts by weight of an organic binder, approximately 75 parts by weight of water (solvent) and approximately 0.3 part by weight of an ammonium acrylate-based dispersing agent were added to 100 parts by weight of the raw material and they were sufficiently mixed through a ball mill. Consequently, slurry was prepared. In respect of environmental protection, an aqueous organic binder containing a modified acryl resin as a main component was used as an organic binder.

Then, the slurry was poured out over a carrier tape from the ball mill, and was shaped into a sheet having a thickness of approximately 0.2 mm and a width of approximately 450 mm by a doctor blade method and was then dried. Consequently, a green sheet was finished.

A plurality of square green sheet pieces having a side of approximately 60 mm were cut out of the green sheet and every five sheets were laminated. A green sheet laminated product thus fabricated was heated to approximately 130° C. while pressing it for approximately 10 minutes at approximately 20 MPa, and was densified and fired in the air in an electric furnace. The firing to be carried out was accomplished by raising a furnace temperature from a room temperature to approximately 500° C. at a temperature raising rate of 100° C./h and maintaining the temperature for two hours, and furthermore, raising to a maximum temperature of approximately 890° C. at a temperature raising rate of 100° C./h and maintaining the temperature for two hours. Consequently, a glass ceramic board was finished. The glass ceramic board thus fabricated had a coefficient of thermal expansion of $4.6 \times 10^{-6}/°$ C. and a transverse strength to bending of approximately 250 MPa to satisfy a performance (a transverse strength to bonding of 200 MPa or more, a coefficient of thermal expansion of $2.5 \times 10^{-6}/°$ C. to $5.0 \times 10^{-6}/°$ C.) which is resistant to practical use for an LSI mounting board or the like.

(2) Preparation of Conductor Paste Containing No Glass

In order to check the influence of the specific surface area of silver powder contained in the conductor paste, only platinum powder was added to silver powder having specific surface areas which are different to each other (the following Table 1). Thus, conductor powder containing 99 wt % of silver and 1 wt % of platinum was prepared.

TABLE 1

Specific surface area of silver powder

| No | Specific surface area (m²/g) |
|----|------------------------------|
| 1  | 5.0                          |
| 2  | 3.0                          |
| 3  | 2.0                          |
| 4  | 1.0                          |
| 5  | 0.5                          |
| 6  | 0.3                          |
| 7  | 0.2                          |

Organic vehicle (polysaccharide such as cellulose) and an organic solvent (terpineol or the like) were added in a proper amount to each of conductor powder (1) to (7), respectively, thereby preparing a conductor paste having a viscosity suitable for screen printing. Consequently, a plurality of conductor pastes which contain no glass but silver powder having specific surface areas different to each other was finished.

Here, the platinum powder was added to the silver powder to prevent silver migration and solder leaching. Accordingly, palladium powder having the same effects may be added to the silver powder in place of the platinum powder.

After preparation of samples was thus completed, they were used to form a silver-based conductor film in the following procedure.

(1) Printing of Conductor Paste on Surface of Glass Ceramic Board

By the use of each conductor paste, screen printing was carried out on the surface of a glass ceramic board to form a conductor pattern having a shape in accordance with estimation items of the silver-based conductor film formed by firing (the estimation of a solder wettability, the estimation of a bonding strength to the ceramic board, the estimation of the wire bonding reliability of a metal wire). More specifically, a pad-shaped pattern of approximately 15 mm per square was printed with different conductor pastes on seven glass ceramic boards for the estimation of the solder wettability, and a pad-shaped pattern of approximately 2.4 mm per square was printed with different conductor pastes on other seven glass ceramic boards for the estimation of the bonding strength to the glass ceramic board. Moreover, a pad-shaped pattern having a pitch of approximately 0.5 mm×1.0 mm and approximately 0.2 mm×1.0 mm was printed with different conductor pastes on further seven glass ceramic boards for the estimation of the wire bonding reliability of the gold wire.

(2) Firing of Conductor Paste on Surface of Glass Ceramic Board

In order to check the influence of a firing temperature, the conductor patterns on the surfaces of the seven glass ceramic boards were fired at temperatures different to each other for each estimation item. In the present embodiment, glass was not added to the conductor paste. Therefore, the firing was carried out at a temperature in the vicinity of the softening point of borosilicate glass contained in the glass ceramic board shown in Table 2. Herein, the softening point indicates a temperature at which a viscosity of the borosilicate glass reaches 107.65 poise.

TABLE 2

Firing temperature of conductor paste

| No | Firing temperature (° C.) | Firing temperature - glass softening point (° C.) |
|----|---------------------------|---------------------------------------------------|
| 1  | 760                       | −60                                               |
| 2  | 770                       | −50                                               |
| 3  | 795                       | −25                                               |
| 4  | 820                       | 0                                                 |
| 5  | 845                       | 25                                                |
| 6  | 870                       | 50                                                |
| 7  | 880                       | 60                                                |

By the fixing, silver-based conductor films fired under temperature conditions different to each other were obtained for the respective estimation items. For the silver-based conductor film for the estimation of a bonding strength to a glass ceramic board, it is necessary to carry out screen printing with the glass paste such that a part of the glass ceramic board (a region of approximately 2 mm×2 mm) is exposed, and to fire the glass paste at approximately 550° C.

After preparation of the silver-based conductor film for each estimation item was thus completed, estimation items (A), (B) and (C) for the silver-based conductor films were estimated in the following manner.

(A) Estimation of Solder Wettability

By the use of a silver solder paste containing 3.5 wt % of tin (manufactured by Senju Kinzoku Co., Ltd.), printing was carried out in a circle having a diameter of approximately 5 mm on each silver-based conductor film for the estimation of the solder wettability, and the solder paste thus printed was heated to approximately 240° C. in a reflow furnace to be subjected to reflow. The diameter of a solder film thus formed was measured and the ratio of solder diameters after the reflow relative to that before the reflow (diameter after reflow/diameter before reflow×100) was calculated as a character for the estimation of the solder wettability.

Figure 2:
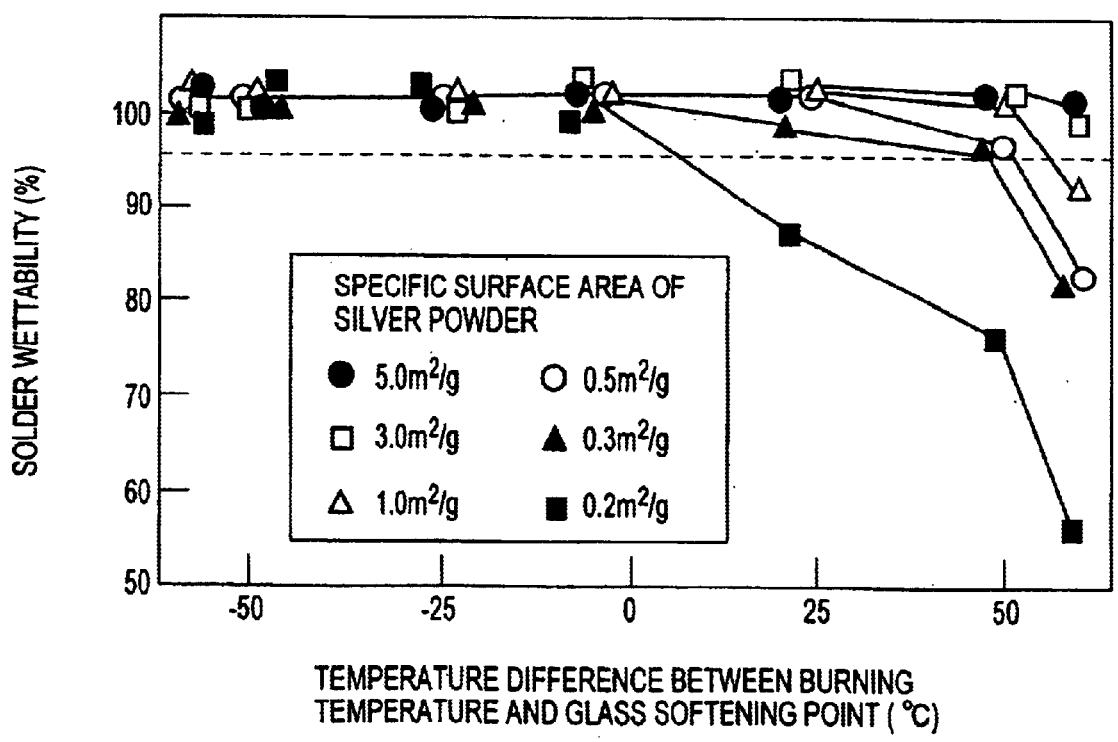
FIG. 2 is a graph showing a relationship between a solder wettability and a firing temperature for each silver-based conductor film formed by using silver powder having specific surface areas which are different to each other.

A calculated value thus obtained was plotted for the specific surface area of each silver powder, an axis of abscissa indicating a difference between a firing temperature of a silver-based conductor film and a softening point of borosilicate glass. FIG. 2 shows a graph thus created. As is apparent from the graph, in the silver-based conductor films formed by any silver powder, the ratio of solder diameter after reflow relative to that before reflow tend to decrease as the difference between the firing temperature and the softening point of borosilicate glass increases. Such a tendency becomes more remarkable as the particle size of the silver powder increases, that is, the specific surface area of the silver powder decreases. More specifically, when silver powder having a specific surface area of 0.3 $m^2/g$ or more was used, a silver-based conductor film indicating the spread of the solder wetting (a solder diameter ratio of 95% or more of solder diameter after reflow relative to that before reflow) which was suitable for practical use was obtained if the firing was carried out at a firing temperature of the borosilicate glass softening point +50° C. or less. However, when the silver powder having a specific surface area of 0.2 $m^2/g$ was used, a silver-based conductor film indicating the spread of the solder wetting (a ratio of solder diameter after reflow relative to that before reflow of 95% or more) which was suitable for practical use cannot be obtained if the firing was not carried out at a firing temperature of the borosilicate glass softening point or less. The cause is supposed as follows. While the glass component of a glass ceramic board is fluidized at a high temperature, the densification of the silver-based conductor film is more inhibited as the particle size of the silver powder increases. For this reason, a pore connected from the glass ceramic board to the surface of the silver-based conductor film is formed through the silver-based conductor film and the glass inhibiting the spread of a solder wetting is exposed from the ceramic board side to the surface of the silver-based conductor film through the pore.

(B) Estimation of Bonding Strength to Glass Ceramic Board

The outer peripheral portion of a soft copper wire having a diameter of approximately 0.6 mm was soldered to an exposed portion (a region of approximately 2 mm×2 mm which was not covered with glass) of each silver-based conductor film for the estimation of a bonding strength to the glass ceramic board, A solder to be used here was the silver solder paste containing 3.5 wt % of tin (manufactured by Senju Kinzoku Co., Ltd.) same as the solder for the estimation of the solder wettabiity.

The soft copper wire soldered to each silver-based conductor film for the estimation of a bonding strength to the ceramic board was bent almost perpendicularly at the base portion and was pulled in a vertical direction with respect to the surface of the glass ceramic board through a tensile testing machine until peeling was caused between the ceramic board and each silver-based conductor film or between the silver-based conductor film and the soft copper wire. At this time, a tension speed was approximately 10 mm/min.

Figure 3:
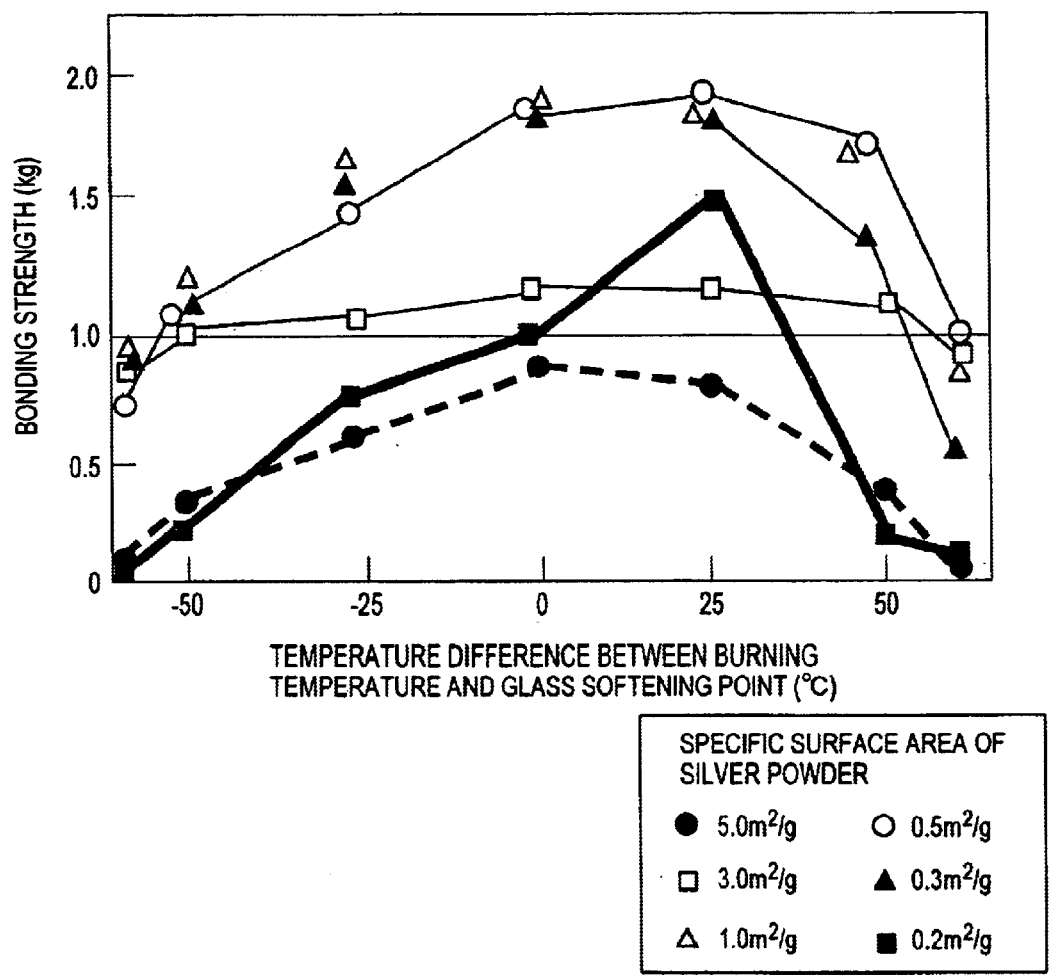
FIG. 3 is a graph showing a relationship between a bonding strength to a ceramic board and a firing temperature for each silver-based conductor film formed by using silver powder having specific surface areas which are different to each other.

Consequently, a strength value thus measured was plotted for the specific surface area of each silver powder, an axis of abscissa indicating a difference between the firing temperature of a silver-based conductor film and the softening point of borosilicate glass. FIG. 3 shows a graph thus creased. As is apparent from the graph, a tensile strength varied depending upon the difference between the firing temperature and the softening point of the borosilicate glass. More specifically, when the firing temperature was much lower or higher than the softening point of the borosilicate glass, the tensile strength decreased. The cause is supposed as follows. If the firing temperature is much lower than the softening point of the borosilicate glass, the glass component of the glass ceramic board is difficult to soften. Therefore, it is impossible to obtain a sufficient anchor effect that glass on the glass ceramic board side intrudes into silver particles or silver crystal particles of the silver-based conductor film and solidifies. For this reason, the bonding strength between the silver-based conductor film and the glass ceramic board decreases so that the peeling is likely to cause between the silver-based conductor film and the glass ceramic board. To the contrary, if the firing temperature is much higher than he softening point of the borosilicate glass, the solder is difficult to wet and spread over the silver-based conductor film as described above. Consequently, the bonding strength between the soft copper wire and the silver-based conductor film decreases so that the peeling between the soft copper wire and the silver-based conductor film is likely to cause.

Moreover, the tensile strength also varied depending upon the specific surface area of a silver particle used for the silver-based conductor film. More specifically, when silver powder having a specific surface area of 5.0 $m^2/g$ was used, a practical requirement for a bonding pad of an electronic circuit board (a tensile strength between the board and the pad of 1 kg or more) could not be satisfied. However, when silver powder having a specific surface area of 0.3 $m^2/g$ to 3.0 $m^2/g$, the firing was carried out at a firing temperature of the borosilicate glass softening point ±50° C. so that the practical requirement for the bonding pad of the electronic circuit board (a tensile strength between the board and the pad of 1 kg or more) could be satisfied. Also, when silver powder having a specific surface area of 0.2 $m^2/g$, the firing was carried out at a firing temperature having a temperature difference of 0° C. to 50° C. from the softening point of the borosilicate glass so that the practical requirement for the bonding pad of the electronic circuit board (a tensile strength between the board and the pad of 1 kg or more) could be satisfied. The reason is supposed as follows.

In general, when a particle size is smaller (a specific surface area is larger), the powder is densified at a lower temperature. Referring to the silver powder, when the specific surface area of the silver powder increases, the silver powder is sufficiently densified at a temperature of the softening point of the borosilicate glass or less and a cavity to produce an anchor effect is difficult to form on a silver-based conductor film. For this reason, the bonding strength between the silver-based conductor film and the glass ceramic board decreases. Referring to the silver-based conductor film formed by the silver powder having a specific surface area of 5.0 $m^2/g$, it is supposed that such a phenomenon occurred.

Moreover, when the specific surface area of the silver powder decreases, the silver particle is difficult to densify. Therefore, the glass component of the glass ceramic board easily appears to the surface of the silver-based conductor film. Consequently, the bonding strength between the soft copper wire and the silver-based conductor film decreases so that the peeling is easily caused between the soft copper wire and the silver-based conductor film. Referring to the silver-based conductor film formed by the silver powder having a specific surface area of 0.2 $m^2/g$ it is supposed that such a phenomenon occued.

The above-mentioned results of the two estimations are generally decided and the following knowledge can be obtained. It has been found from (B) the estimation of the bonding strength to the glass ceramic board that in the case where silver powder having a specific surface area of 0.3 m$^2$/g to 3.0 m$^2$/g is used, the firing is carried out at a firing temperature having a difference of ±50° C. from the softening point of the borosilicate glass so that the practical requirement for the bonding pad of the electronic circuit board (a tensile strength between the board and the pad of 1 kg or more) can be satisfied. In the case where silver powder having a specific surface area of 0.2 m$^2$/g is used, the firing is carried out at a firing temperature having a temperature difference of 0° C. to 50° C. from the softening point of the borosilicate glass so that the practical requirement for the bonding pad of the electronic circuit board (a tensile strength between the board and the pad of 1 kg or more) can be satisfied. However, it has been found from (A) the estimation of the solder wettability that in the case where the silver powder having a specific surface area of 0.2 m$^2$/g is used and the difference between the firing temperature and the softening point of the borosilicate glass is set to be 0° C. to 50° C., the silver-based conductor film indicating the spread of a solder wetting suitable for practical use (the ratio of solder diameter after reflow relative to that before reflow is 95% or more) cannot be obtained. Accordingly, it has been found that the reliability of the electrical connection of the silver-based conductor film formed on the surface of the glass ceramic board can be enhanced by satisfying two conditions, that is, to use a conductor paste containing a silver particle having a specific surface area of 0.3 m$^2$/g to 3.0 m$^2$/g and no glass and to carry out the firing at a firing temperature having the difference from the softening temperature of the borosilicate glass contained in a board material of ±50° C. or less.

(C) Estimation of Wire Bonding Reliability of Gold Wire

A gold wire having a diameter of 30 μm was bonded onto each silver-based conductor film for the estimation of the wire bonding reliability of a gold wire by an ultrasonic and thermo-compression bonding method. The gold wire bonded onto each silver-based conductor film for the estimation of the wire bonding reliability of the gold wire is pulled in a vertical direction with respect to the surface of a glass ceramic board until the gold wire and each silver-based conductor film are broken away. At this time, a rate of pulling is approximately 10 mm/min. As a result it has been found that a practical requirement for a bonding pad of an electronic circuit board (a tensile strength between the pad and the wire of 6 g or more) is also satisfied in the case where the conditions obtained by the two estimations (the estimation of the solder wettability and the estimation of the bonding strength to the board) are satisfied.

Figure 4:
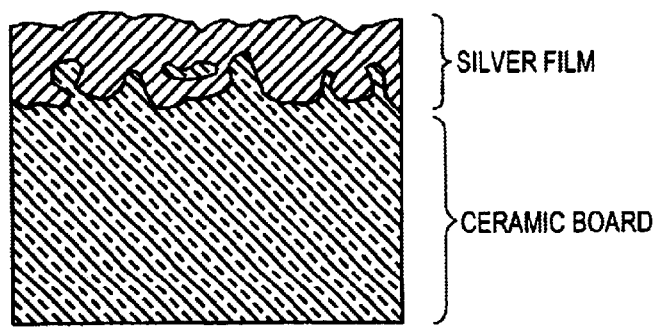
FIG. 4 is a sectional view showing a silver-based conductor film portion of a glass ceramic board according to an embodiment of the present invention.

From the results of the three estimations (A), (B) and (C), in the present embodiment, it has been found that the reliability of the electrical connection of the silver-based conductor film formed on the surface of the glass ceramic board can be enhanced by satisfying two conditions, that is, to carry out the firing at a firing temperature having the difference from the softening temperature of the borosilicate glass contained in a board material of ±50° C. and to use a conductor paste containing a silver particle having a specific surface area of 0.3 m$^2$/g to 3.0 m$^2$/g and no glass. The section of the silver-based conductor film formed so as to satisfy these two conditions was observed by means of a scanning electron microscope. As shown in FIG. 4, consequently, it has been confirmed that the glass could be prevented from being exposed from the surface of the silver-based conductor film. Moreover, it has also been confirmed that the glass ceramic board and the silver-based conductor film were firmly bonded by the anchor effect produced by the intrusion and solidification of a glass component on the glass ceramic board side between silver particles or silver crystal particles in the silver-based conductor film.

Figure 5:
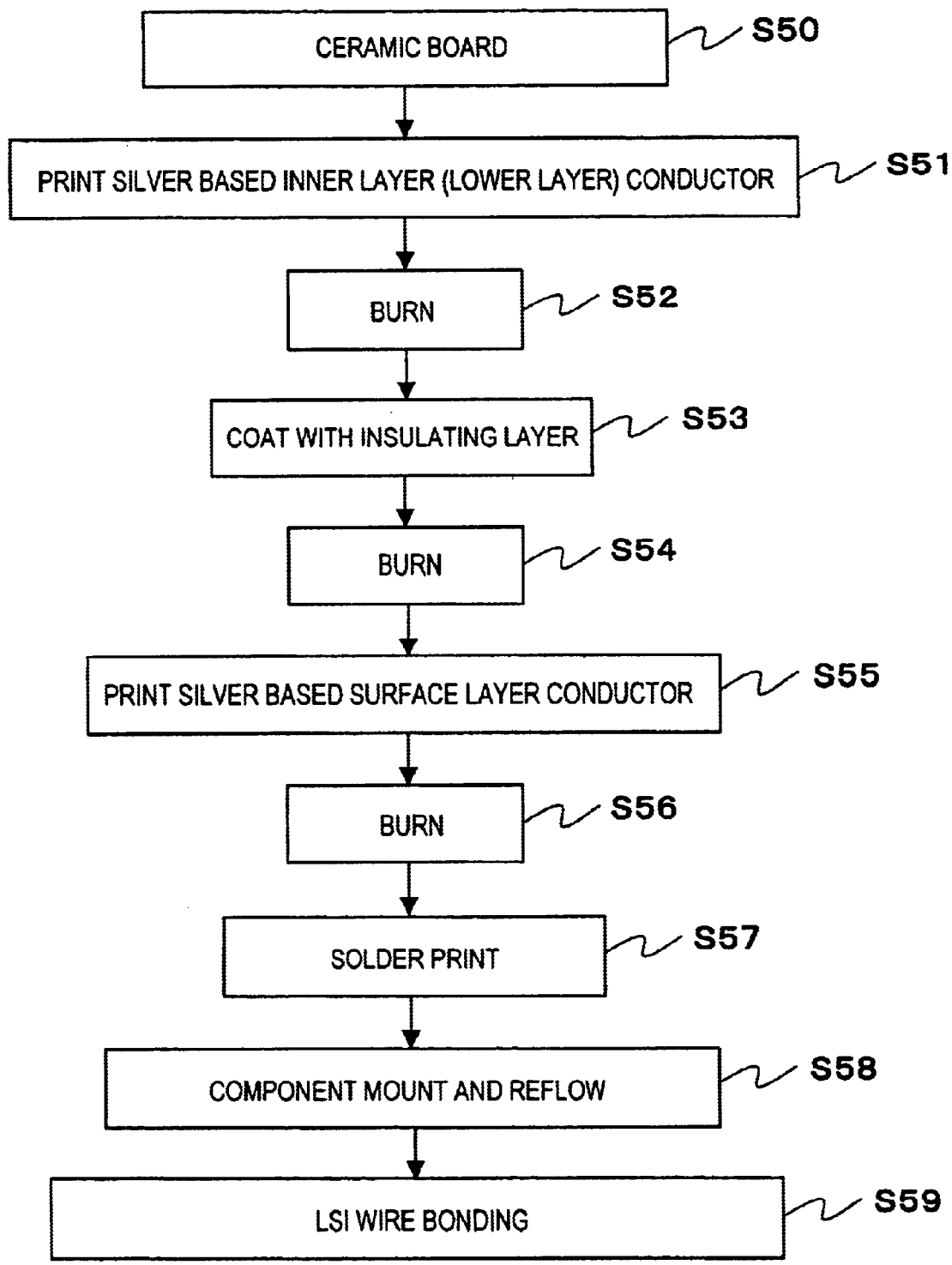
FIG. 5 is a flow chart showing a process for manufacturing an electronic component according to an embodiment of the present invention.

Next, a method of manufacturing electronic components based on the knowledge thus obtained will be described with reference to FIG. 5. The case where a tick film processing is utilized will be taken as an example.

First of all, borosilicate glass powder (55% by weight) and alumina powder (45% by weight) were mixed to prepare a raw material. Approximately 14 parts by weight of an aqueous organic binder containing a modified acryl resin as a main component, approximately 75 parts by weight of water (solvent) and 0.3 part by weight of an ammonium acrylate based dispersing agent were added to 100 parts by weight of the raw material and they were sufficiently mixed through a ball mill. The slurry thus prepared was poured out over a carrier tape, and was shaped into a sheet having a uniform thickness and was then dried by a doctor blade method. Consequently, a green sheet was finished. The green sheet was divided into green sheet pieces having a proper size. Each green sheet piece was densified and fired in an electric furnace. In the firing to be carried out here, a furnace temperature was raised from a room temperature to approximately 500° C. at a temperature raising rate of 100° C./h and was maintained this temperature for two hours, and furthermore, was raised to a maximum temperature of approximately 890° C. at a temperature raising rate of 100° C./h and was maintained the temperature for two hours (S50).

A conductor pattern to be a wiring layer of a thick film ceramic board was screen printed with a conductor paste over the surface of each glass ceramic board thus fabricated (S51). The conductor paste to be used was obtained which has an appropriate viscosity by adding a proper amount of organic vehicle (polysaccharides such as cellulose) and an organic solvent (terpineol or the like) to conductor powder containing 1 wt % of platinum powder or palladium powder and 99 wt % of a silver particle which have a specific surface area of 0.3 m$^2$/g to 3.0 m$^2$/g. As a matter of course, no glass was contained.

Next, the conductor pattern of the surface of each glass ceramic board was fired in the air at a temperature of ±50° C. of the softening point of the borosilicate glass contained in the glass ceramic board (S52). When a wiring layer was thus formed, it was coated with a glass paste having a low dielectric constant (S53) and the glass paste was fired. Consequently, an insulating layer was formed on the wiring layer (S54). By alternately repeating the process for forming the wiring layer (S51 and S52) and the process for forming the insulating layer (S53 and S54), the wiring was multi-layered.

Furthermore, a conductor pattern to be a component-mounting pad and a terminal pad was screen printed on the surface of the uppermost insulating layer of each glass ceramic board through a conductor paste having the same composition as that of the conductor paste used in the formation of the wiring layer (S55). The conductor pattern was fired at a temperature of ±50° C. of the softening point of the borosilicate glass contained in the glass ceramic board. Consequently, the component-mounting pad and the terminal pad were formed (S56). Consequently, a thick film ceramic board was completed.

By the use of the silver solder paste containing 3.5 wt % of tin, printing was carried out on the component-mounting pad of each thick film ceramic board thus finished (S57). Then, each solder paste was heated to approximately 240° C.

in a reflow furnace to be subjected to reflow in such a state that the LSI-mounting surface was in contact with the solder paste. Consequently, the LSI was mounted on each hick film ceramic board (S58).

Furthermore, a gold wire having a diameter of 30 μm was bonded onto the terminal pad and the terminal of the LSI of each thick film ceramic board by an ultrasonic thermo-compression bonding method, respectively (S59). Consequently, an electronic component was finished.

Figure 6:
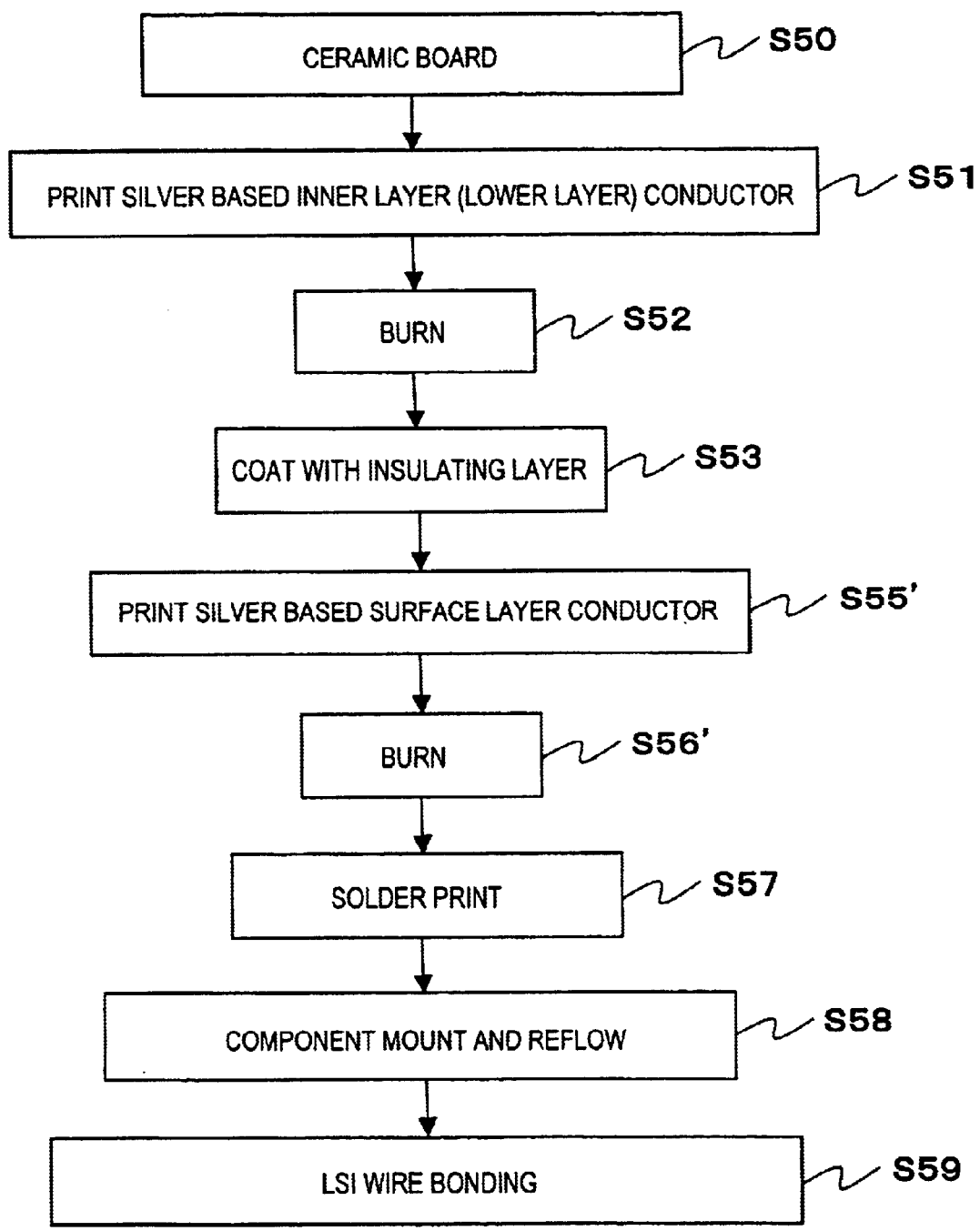
FIG. 6 is a flow chart showing the process for manufacturing an electronic component according to the embodiment of the present invention.

While screen printing was carried out with the conductor paste on the surface of the uppermost insulating layer which has been fired and was then fired to form the bonding pad in the above description, it was not necessary to always apply such a way. For example, as shown in FIG. 6, the process for firing the glass paste to be the uppermost layer (corresponding to S54 in FIG. 5) may be omitted to print with the conductor paste a conductor pattern to be the bonding pad on the glass paste to be the uppermost insulating layer (S55') and the glass paste and the conductor paste may be collectively fired (S56'). Other processes in FIG. 6 are the same as the processes having the same reference numerals in FIG. 5.

Moreover, while the thick film processing is used in the above description, a sheet lamination method may be utilized as will be described below.

Figure 7:
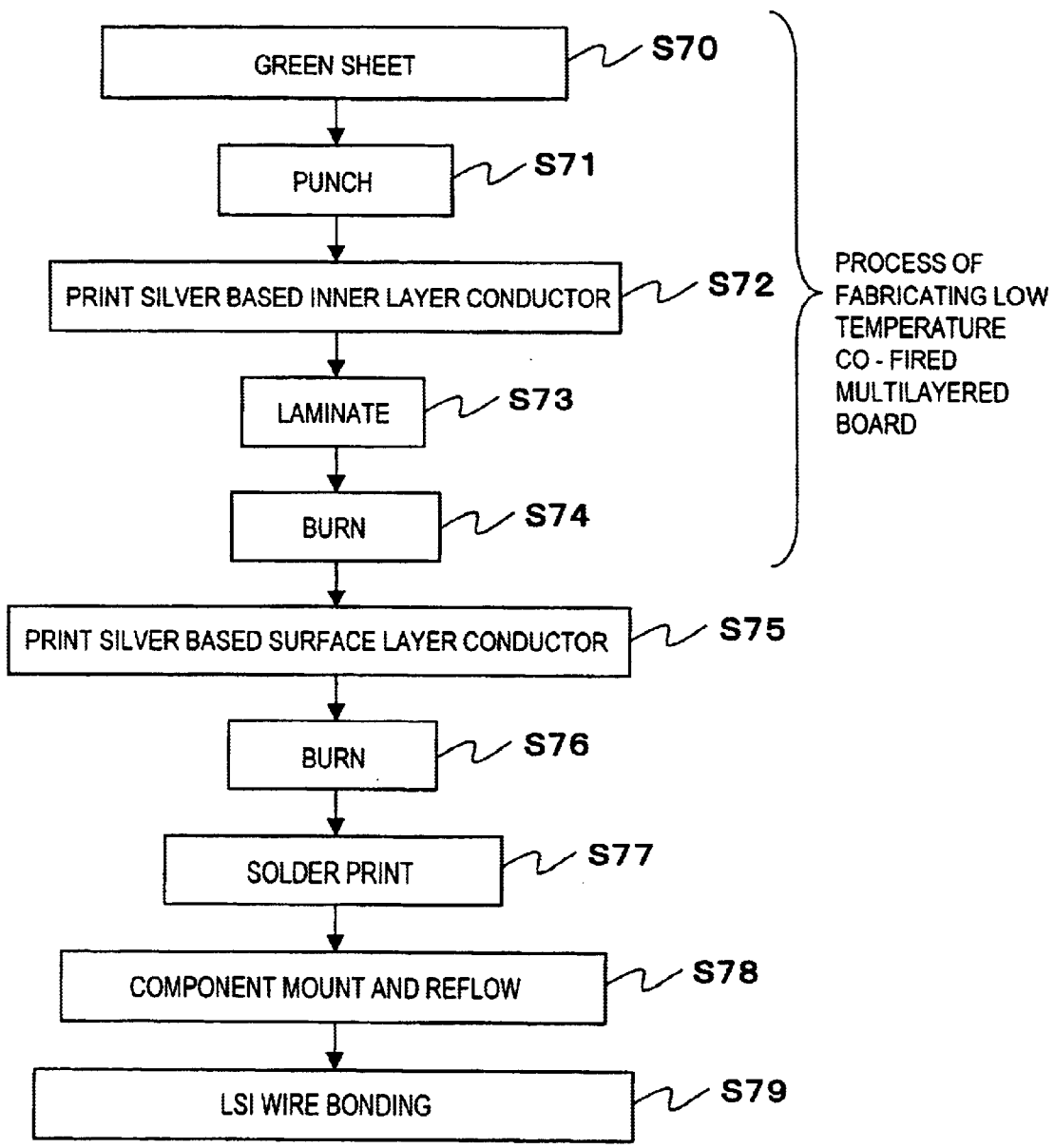
FIG. 7 is a flow chart showing the process for manufacturing an electronic component according to the embodiment of the present invention.

In the case where the sheet lamination method was utilized, as shown in FIG. 7, a green sheet of glass ceramic was first fabricated by the same process as that in the above case utilizing the thick film processing (S70). The green sheet was divided into green sheet pieces having a proper size and a through hole for connecting upper and lower wiring layers was punched out of each green sheet piece through a mold (S71). Furthermore, by the use of the same conductor paste as that in the above case utilizing the thick film processing, printing was carried out on each green sheet piece so that the through hole of the green sheet piece was filled with the conductor paste and a wiring pattern was printed on the surface of the green sheet piece. At this time, conductor patterns to be a component-mounting pad and a terminal pad were collectively formed on the surface of the green sheet piece to be the uppermost layer of a low temperature sintered glass ceramic multilayered board (S72).

Then, a predetermined number of green sheet pieces were laminated to form a laminated product (S73). The laminated product was fired in the air at a temperature of ±50° C. of the softening point of the borosilicate glass contained in the green sheet (S76). Consequently, a low temperature fired glass ceramic multilayered board was fished.

By the use of the silver solder paste containing 3.5 wt % of tin, printing was carried out on the component-mounting pad of the low temperature fired glass ceramic multilayered board thus finished in the same manner as the component-mounting pad of the thick film ceramic board (S77). Then, each solder paste was heated to approximately 240° C. in a reflow furnace to be subjected to reflow in such a state that the LSI-mounting surface was in contact with the solder paste. Consequently, the LSI is mounted on each low temperature fired glass ceramic multilayered board (S78).

Furthermore, a gold wire having a diameter of 30 μm was bonded onto the terminal pad and the terminal of the LSI of each low temperature fired glass ceramic multilayered board by an ultrasonic thermo-compression bonding method, respectively (S79). Consequently, an electronic component was finished.

By thus applying the above knowledge to the sheet lamination method, the bonding pad of the ceramic multi-layered board can also be formed of the same silver-based conductor as that of the wiring pattern. Therefore, the surface layer conductor of the ceramic multilayered board can be formed through one-time printing and onetime firing. Consequently, a production cost can be reduced usefully.

As described above, according to the present invention, it is possible to enhance the reliability of the electrical connection of the silver-based conductor film of the glass ceramic board.

What is claimed is:

1. An electronic component comprising:

a ceramic board containing glass; and a conductor film stuck to the ceramic board, wherein the conductor film is formed by firing a conductor paste, which does not contain any glass and which contains a silver particle having a specific surface area of 0.3 m²/g to 3.0 m²/g before the firing, at a temperature having a difference of ±50° C. from a softening temperature of the glass, the conductor paste having been stuck on a glass ceramic sheet board which has not been sintered or has been sintered.

2. An electronic component comprising:

a ceramic board containing glass; and a conductor film stuck to the ceramic board and containing silver, wherein the glass intrudes into the conductor film from a surface on the ceramic board side and is not exposed on a surface of the opposite side of the ceramic board, and wherein the conductor film is formed by firing a conductor paste, which does not contain any glass and which contains a silver particle having a specific surface area of 0.3 m²/g to 3.0 m²/g before the firing, at a temperature having a difference of ±50° C. from a softening temperature of the glass, the conductor paste having been stuck on a glass ceramic sheet board which has not been sintered or has been sintered.

3. A method of manufacturing an electronic component which has a conductor film formed on a glass ceramic board, comprising the steps of:

a process for sticking a conductor paste containing a silver particle having a specific surface area of 0.3 m²/g to 3.0 m²/g prior to firing and no glass onto a glass ceramic sheet board which has not been sintered or has been sintered; and a process for firing the conductor paste at a temperature having a difference of ±50° C. from a softening temperature of the glass and for forming the conductor film on the glass ceramic board.

4. An electronic component which has a conductor film formed on a glass ceramic board, formed by a method comprising the steps of:

sticking a conductor paste, containing a silver particle having a specific surface area of 0.3 m²/g to 3.0 m²/g in the conductor paste prior to firing, and no glass, onto a glass ceramic sheet board which has not been sintered or has been sintered; and firing the conductor paste at a temperature having a difference of ±50° C. from a softening temperature of the glass of the glass ceramic board and for forming the conductor film on the glass ceramic board.

5. An electronic component according to claim 1, wherein the conductor paste includes, in addition to silver, at least one selected from the group consisting of platinum and palladium.

6. An electronic component according to claim 5, wherein the at least one selected from the group consisting of platinum and palladium is included in the conductor paste in an amount sufficient to prevent silver migration and solder leaching.

7. An electronic component according to claim 1, wherein said glass of said ceramic board is a borosilicate glass.

8. An electronic component according to claim 2, wherein said glass of said ceramic board is a borosilicate glass.

9. An electronic component according to claim 4, wherein said glass of said glass ceramic board is a borosilicate glass.

* * * * *